United States Patent
Marfatia et al.

(10) Patent No.: US 9,858,217 B1
(45) Date of Patent: Jan. 2, 2018

(54) WITHIN-DIE SPECIAL OSCILLATOR FOR TRACKING SRAM MEMORY PERFORMANCE WITH GLOBAL PROCESS VARIATION, VOLTAGE AND TEMPERATURE

(71) Applicant: QUALCOMM Incorporated, San Diego, CA (US)

(72) Inventors: Percy Tehmul Marfatia, Bangalore (IN); Rajagopal Narayanan, Bangalore (IN); Shih-Hsin Jason Hu, San Diego, CA (US); Nan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/197,524

(22) Filed: Jun. 29, 2016

(51) Int. Cl.
| | |
|---|---|
| G11C 11/00 | (2006.01) |
| G06F 13/16 | (2006.01) |
| G11C 11/417 | (2006.01) |
| G11C 7/22 | (2006.01) |
| G11C 7/04 | (2006.01) |
| G11C 7/10 | (2006.01) |

(52) U.S. Cl.
CPC ............ *G06F 13/1689* (2013.01); *G11C 7/04* (2013.01); *G11C 7/1072* (2013.01); *G11C 7/22* (2013.01); *G11C 11/417* (2013.01)

(58) Field of Classification Search
CPC ......... G11C 11/00; G11C 7/04; G11C 7/1072; G11C 7/22; G06F 13/1689
USPC ....................................................... 365/154
See application file for complete search history.

(56) References Cited

U.S. PATENT DOCUMENTS

| | | | |
|---|---|---|---|
| 7,492,626 B2 | 2/2009 | Chanussot et al. | |
| 7,542,327 B2 | 6/2009 | Zimmermann | |
| 8,004,878 B2 | 8/2011 | Asayama et al. | |
| 8,305,825 B2 | 11/2012 | Van et al. | |
| 8,958,237 B1* | 2/2015 | Yang | G11C 11/419 365/154 |
| 2007/0096775 A1 | 5/2007 | Elgebaly et al. | |
| 2007/0280022 A1 | 12/2007 | Nguyen et al. | |

FOREIGN PATENT DOCUMENTS

JP     2013045473     3/2013

OTHER PUBLICATIONS

International Search Report and Written Opinion—PCT/US2017/032232—ISA/EPO—dated Sep. 6, 2017.

\* cited by examiner

*Primary Examiner* — Harry W Byrne
(74) *Attorney, Agent, or Firm* — Arent Fox, LLP

(57) ABSTRACT

An apparatus includes a memory, a timing circuit configured to emulate a first operation of the memory to activate a second operation of the memory, a sensor configured to emulate a portion of the timing circuit, and a controller configured to adjust an operating parameter of the memory based on the sensor emulating the portion of the timing circuit. A method is presented. The method includes at least operating a timing circuit to emulate a first operation of the memory, activating a second operation of the memory based on the emulating the first operation of the memory, emulating, by a sensor, a portion of the timing circuit. Another apparatus is presented. The apparatus includes at least a memory, a timing circuit, and means for tracking a performance of the memory based on the timing circuit tracking a memory operation.

12 Claims, 12 Drawing Sheets

WITHIN-DIE SPECIAL OSCILLATOR FOR TRACKING SRAM MEMORY PERFORMANCE WITH GLOBAL PROCESS VARIATION, VOLTAGE AND TEMPERATURE

BACKGROUND

Field

The disclosure relates to apparatuses with memories and sensors and, in particular, to electronic apparatuses and integrated circuits (ICs) with sensors for tracking memory performance.

Background

Implementing sensors in an IC may be helpful in improving the performance of the IC in various ways. For example, temperature sensors may be placed in an IC for wireless communication to manage and to mitigate the heat generated by operations of the IC. Wireless communication technologies and devices (e.g., cellular phones, tablets, laptops, etc.) have grown in popularity and usage in recent years. These electronic apparatuses have grown in complexity and now commonly incorporate multiple processors (e.g., baseband processor and/or application processor) and other ICs that allow the users to run complex and power intensive software applications (e.g., music players, web browsers, video streaming applications, etc.). To meet the increasing performance demands, ICs have increased in complexity and operate at clock frequencies in the gigahertz range. As a result, substantial heat may be produced while operating the processors at high frequencies. The heat generated by the processors may affect performance and reliability of the device. For example, both performance and reliability of the IC may degrade when operating at high temperature for a prolonged period of time.

In some examples, sensors may be used to manage temperatures and performances of circuit blocks on the IC. For example, the sensor may measure performance metrics of a circuit block, such as operating speed over process, voltage, and/or temperature variations. The IC may adjust the operating parameters of the circuit block, such as the operating voltage or the operating frequency, based on the outputs of the sensor (e.g., measured performance metrics of the circuit block). In such fashion, the IC may minimize the operating parameters for the workload requirement, and reduce the heat generated by the circuit block.

Thus, one design concern is how to improve the operating and usage of such sensors.

SUMMARY

Aspects of an apparatus are disclosed. In one implementation, the apparatus includes a memory, a timing circuit configured to emulate a first operation of the memory to activate a second operation of the memory, a sensor configured to emulate a portion of the timing circuit, and a controller configured to adjust an operating parameter of the memory based on the sensor emulating the portion of the timing circuit.

Aspects of a method for operating a memory are disclosed. In one implementation, the method includes operating a timing circuit to emulate a first operation of the memory, activating a second operation of the memory based on the emulating the first operation of the memory, emulating, by a sensor, a portion of the timing circuit, and adjusting an operating parameter of the memory based on the sensor emulating the portion of the timing circuit.

Aspects of another apparatus are disclosed. In one implementation, the apparatus includes a memory configured to operate a memory operation, a timing circuit configured to track the memory operation, means for tracking a performance of the memory based on the timing circuit tracking the memory operation, and means for adjusting an operating parameter of the memory based on the means for tracking.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and details of these aspects are capable of modification in various other respects. Accordingly, the drawings and detailed description are to be regarded as illustrative in nature and not as restrictive.

DETAILED DESCRIPTION

Figure 1:
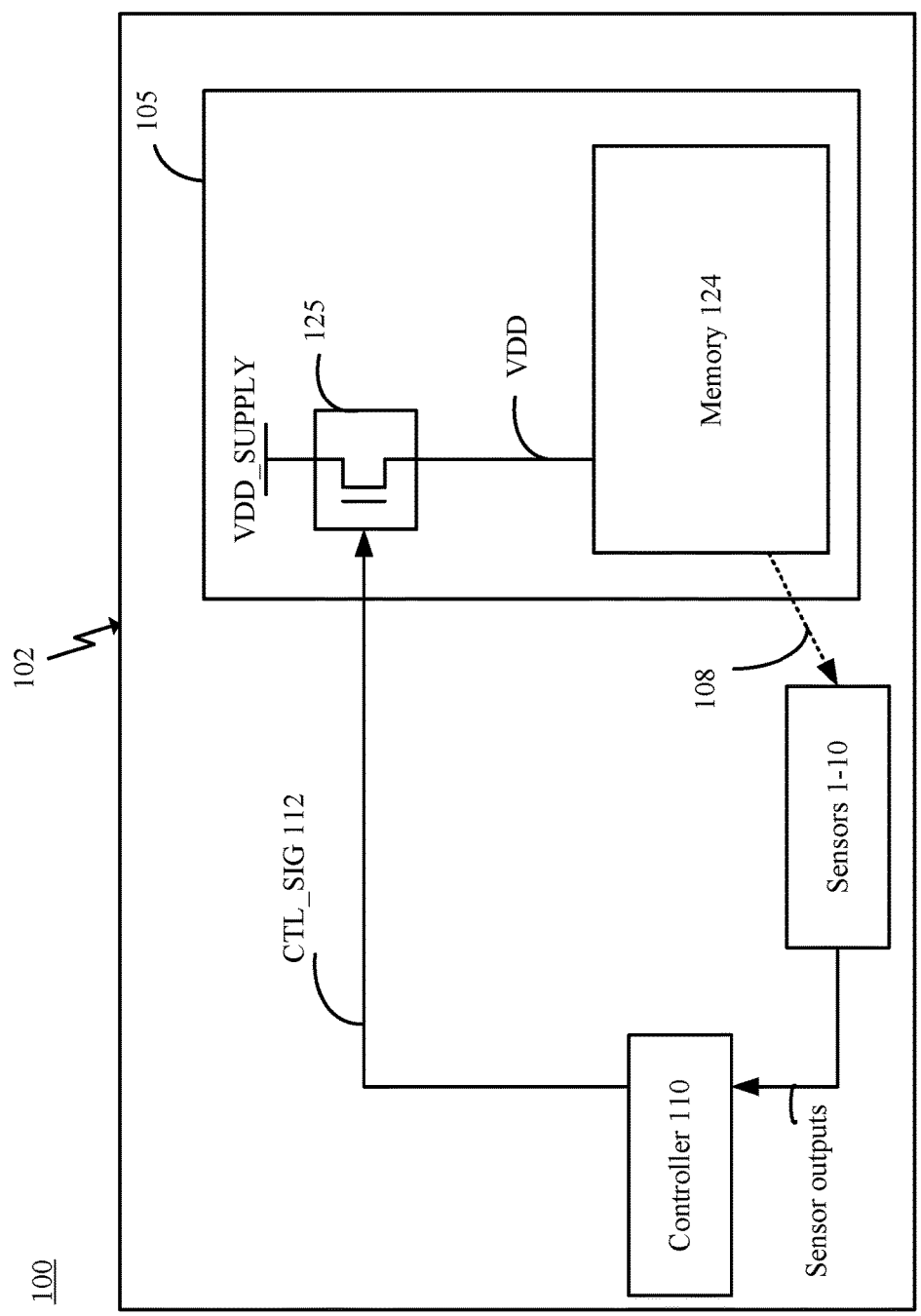
FIG. 1 is a diagram of an exemplary embodiment of a scheme to utilize a sensor for tracking memory performance to operate a memory.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of the disclosure will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system. Various apparatus and methods presented throughout this disclosure may be implemented in various forms of hardware. By way of example, any of the apparatus or methods, either alone or in combination, may be implemented as an integrated circuit, or as part of an integrated circuit. The integrated circuit may be an end product, such as a microprocessor, a digital signal processor (DSP), an application specific integrated circuit (ASIC), programmable logic, or any other suitable integrated circuit. Alternatively, the integrated circuit may be integrated with other chips, discrete circuit elements, and/or other components as part of either an intermediate product, such as a motherboard, or an end product.

The methods disclosed herein comprise one or more operations or actions for achieving the described method. The method operations and/or actions may be interchanged with one another without departing from the scope of the claims. In other words, unless a specific order of operations or actions is specified, the order and/or use of specific operations and/or actions may be modified without departing from the scope of the claims.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of apparatus and methods for sensors for tracking memory performances are provided in the context static random access memories (SRAM) incorporated within in IC. However, as those skilled in the art will readily appreciate, aspects and applications of the disclosure may not be limited thereto. Accordingly, all references to a specific application for the presented apparatus or method are intended only to illustrate exemplary aspects of the apparatus or method with the understanding that such aspects may have a wide differential of applications.

FIG. 1 is a diagram of an exemplary embodiment of a scheme to utilize a sensor for tracking memory performance to operate a memory. The diagram 100 includes an IC 102 incorporating sensors 1-10, a circuit block 105, and a controller 110. The circuit block includes the voltage regulator 125 powering a memory 124.

The controller 110 outputs the control signal CTL_SIG 112 to adjust an operating parameter (e.g., operating voltage) of the memory 124 based on the sensor outputs of the sensors 1-10. The sensors 1-10 have a relationship 108 with the memory 124. For example, the sensors 1-10 may be in proximity with the memory 124 so as to operate with the process, voltage, and temperature variations of the memory 124. Thus, the performance of the sensors 1-10 (hence the sensor outputs) may be based on and/or reflect the process, voltage, and temperature variations of the memory 124. In some examples, the sensors 1-10 may include an oscillator, and the oscillating frequency of the oscillator may be based on the process, voltage, and temperature variations of the memory 124.

The controller 110 receives the sensor outputs of the sensors 1-10 and based thereupon, outputs the control signal CTL_SIG 112 to the voltage regulator 125. For example, the controller 110 may generate the signal CTL_SIG 112 based on the oscillating frequency of the sensors 1-10. The voltage regulator 125 couples the voltage supply VDD_SUPPLY to the memory 124. The voltage regulator 125 may adjust the operating voltage (e.g., an example of an operating parameter) of the memory 124 based on the control signal CTL_SIG 112. For example, the voltage regulator 125 may regulate the VDD_SUPPLY voltage and output VDD to the memory 124, in response to the setting of the CTL_SIG 112 signal. The voltage regulator 125 is illustrated as an n-type transistor, but is not limited thereto (e.g., other types of voltage regulator may be used here). In some examples, the voltage regulator 125 may not share a substrate with the IC 102 (for e.g. it may be a different component on the board), and the controller form the IC 102 may output the CTL_SIG 112 signal to the voltage regulator 125 outside of the IC 102. In some examples, the voltage regulator 125 may be shared by memories across various circuit blocks.

In some examples, the sensors 1-10 may have an oscillating frequency faster than a threshold frequency. In response to the sensor outputs, the controller 110 may output the CTL_SIG 112 signal to lower the operating voltage VDD of the memory 124, via the voltage regulator 125. In some example, the operating voltage VDD may be lowered while still meeting the workload demands. In such fashion, the IC 102 may lower the power consumed and the heat generated based on the sensor outputs.

Figure 2:
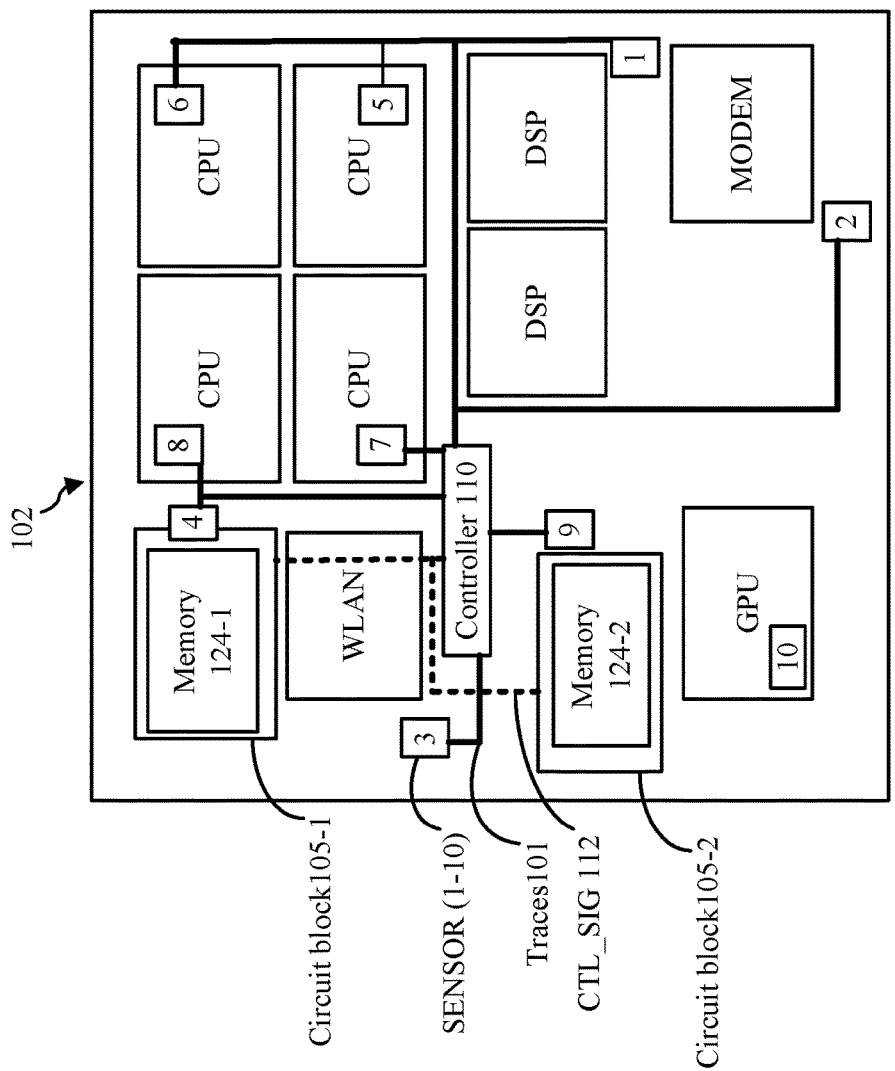
FIG. 2 is a diagram of an exemplary embodiment of an IC incorporating the sensors for tracking performance characteristics of memories.

FIG. 2 is a diagram of an exemplary embodiment of an IC incorporating the sensors for tracking performance characteristics of memories. The IC 102 may be on one or more discrete substrates and may include a processor or processors for wireless communication. For example, the IC 102 may incorporate an integrated application and baseband processor for a cell phone. The IC 102 includes various circuit blocks or cores, such as graphic processor unit (GPU), DSP, modem, central processing units (CPU), and a wireless local area network (WLAN) component. A circuit block may be, for example, a collection of circuits.

The IC 102 also includes various sensors to measure physical parameters of associated circuit blocks. In some examples, the physical parameters may be temperature, voltage, or performance (e.g., operating speed). For example, the IC 102 includes the sensor 3 to measure the operating speeds of the memory 124-1 or 124-2. In some examples, the memory 124-1 may in incorporated within the circuit block 105-1, and the memory 124-2 may be incorporated within the circuit block 105-2. The memories 124-1 and 124-2 may be unrelated. For example, the memories 124-1 and 124-2 may be different types of memories and may be activated at different times. The circuit blocks 105-1 and 105-2 may likewise be unrelated circuit blocks.

The sensors 1-10 (shown as boxes 1-10 in the figure) may communicate with the controller 110 via the conductive trace 101. For example, the controller 110 may provide signals to control the sensors 1-10, and the sensors 1-10 may output the sensor outputs to the controller 110 via the conductive trace 101. The controller 110 receives the sensor outputs and based thereupon, outputs the control signal CTL_SIG 112 to the voltage regulators within the circuit blocks 105-1 and 105-2. Accordingly, the controller 110 may, based on the outputs of the sensor 3, adjust the operating parameters (e.g., operating voltages) of the memories 124-1 and/or 124-2. Certain communications between the memories 124-1 and 124-2 and the controller 110 are not shown in FIG. 2 for clarity.

Figure 3:
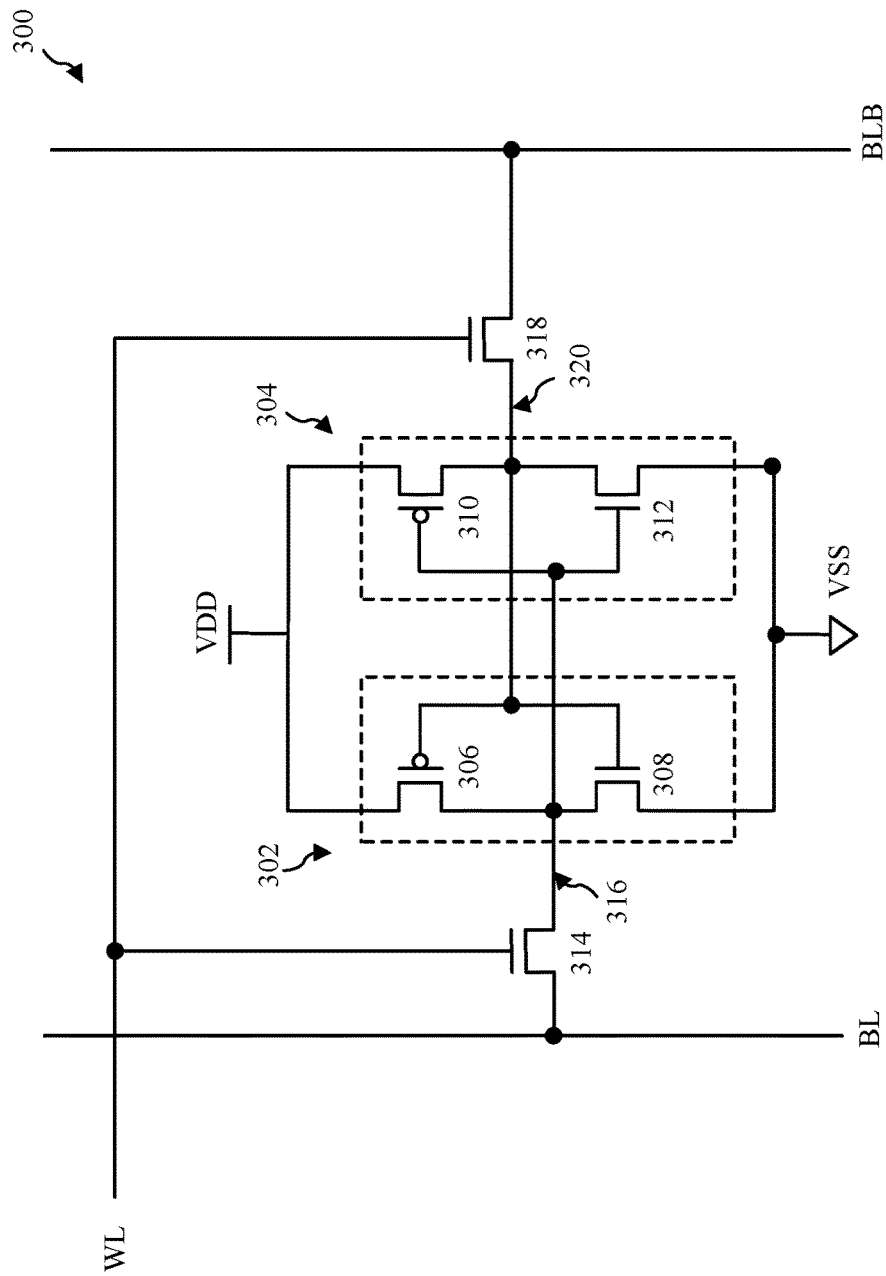
FIG. 3 is a circuit diagram of an exemplary embodiment of a memory cell for an SRAM.

The memory 124 (e.g., one of the memories 124-1 and/or 124-1) may be any suitable storage medium, such as, by way of example, an SRAM. However, as those skilled in the art will readily appreciate, the memory 124 is not necessarily limited to SRAM. An SRAM includes an array of storage elements known as "cells," "memory cells," or "bitcells." Each memory cell may be configured to store one bit of data (e.g., logic 1 or logic 0). FIG. 3 is a circuit diagram of an exemplary embodiment of a memory cell for an SRAM. The memory cell 300 is implemented with a six-transistor (6T) configuration. However, as those skilled in the art will readily appreciate, the cell may be implemented with a four-transistor (4T) configuration or any other suitable transistor configuration.

The memory cell 300 is shown with two inverters 302, 304. The first inverter 302 includes a p-channel transistor 306 and an n-channel transistor 308. The second inverter 304 includes a p-channel transistor 310 and an n-channel transistor 312. In the described embodiment, the inverters 302 and 304 are powered by VDD and have a return VSS (e.g., ground). The first and second inverters 302, 304 are interconnected to form a cross-coupled latch. A first n-channel access transistor 314 couples the output node 316 from the first inverter 302 to a bitline BL, and a second n-channel access transistor 318 couples the output node 320 from the second inverter 304 to a bitline BLB (the value of which is the opposite or inverse of the bitline BL). The gates of the access transistors 314, 318 are coupled to a wordline WL.

A read operation may be initiated by precharging or charging the bitlines BL and BLB to a predetermined level, which is determined so as not to disturb the stored data in the memory cell 300. In some examples, a precharge circuit BLPC 412 (shown in FIG. 4) precharges or pulls up the bitlines BL and BLB to a predetermined level that does not flip the stored data. The predetermined level may be a high level or VDD. In some examples, the predetermined level may be a portion (e.g., half) of VDD. The wordline WL then is asserted, connecting the cross-coupled inverters 302, 304 to the bitlines BL and BLB via the access transistors 314 and 318, respectively. By way of example, the memory cell 300 may store the logic 1 by storing a low level (e.g., ground) at the output node 316 and a high level (e.g., VDD) at the output node 320. These states are maintained by the cross-coupled inverters 302, 304. Upon asserting the wordline WL, the inverter 302 discharges the bitline BL through the access transistor 314 and the output node 316. The bitline BLB is maintained at the high level by the inverter 304 through the access transistor 318 and the output node 320. A voltage difference on the bitline pair BL and BLB is thus established by the pull-down of the bitline BL.

The bitlines BL and BLB are fed to a sense amplifier (SA), which senses the data (e.g., voltage difference) carried thereon and outputs a logic level (e.g., logic 1) as the read data to the peripheral circuit external to the memory. The SA will be discussed in details infra.

A write operation may be initiated by setting the bitlines BL and BLB to the value to be written to the memory cell 300 and asserting the wordline WL. That is, the write data are driven onto the bitlines BL and BLB. The wordline WL may be asserted before or after the value to be written (e.g., write data) is provided to the bitlines BL and BLB. By way of example, a logic 1 may be written to the memory cell 300 by setting the bitline BL to a logic level 0 and the bitline BLB to a logic 1. The logic level 0 at the bitline BL is applied to the input of the second inverter 304 through the access transistor 314, which in turn forces the output node 320 of the second inverter 304 to VDD. The output node 320 of the second inverter 304 is applied to the input of the first inverter 302, which in turn forces the output node 316 of the first inverter 302 to VSS. A logic level 0 may be written to the memory cell 300 by inverting the values of the bitlines BL and BLB. The write driver is designed to be stronger than the pull-up transistors (306 and 310) in the memory cell 300 so that the write data can override the previous state of the cross-coupled inverters 302, 304.

Once the read or write operation is complete, the wordline is de-asserted, thereby causing the access transistors 314 and 318 to disconnect the bitlines BL and BLB from the two inverters 302, 304. The cross-coupling between the two inverters 302, 304 maintains the state of the inverter outputs as long as power is applied to the memory cell 300.

Figure 4:
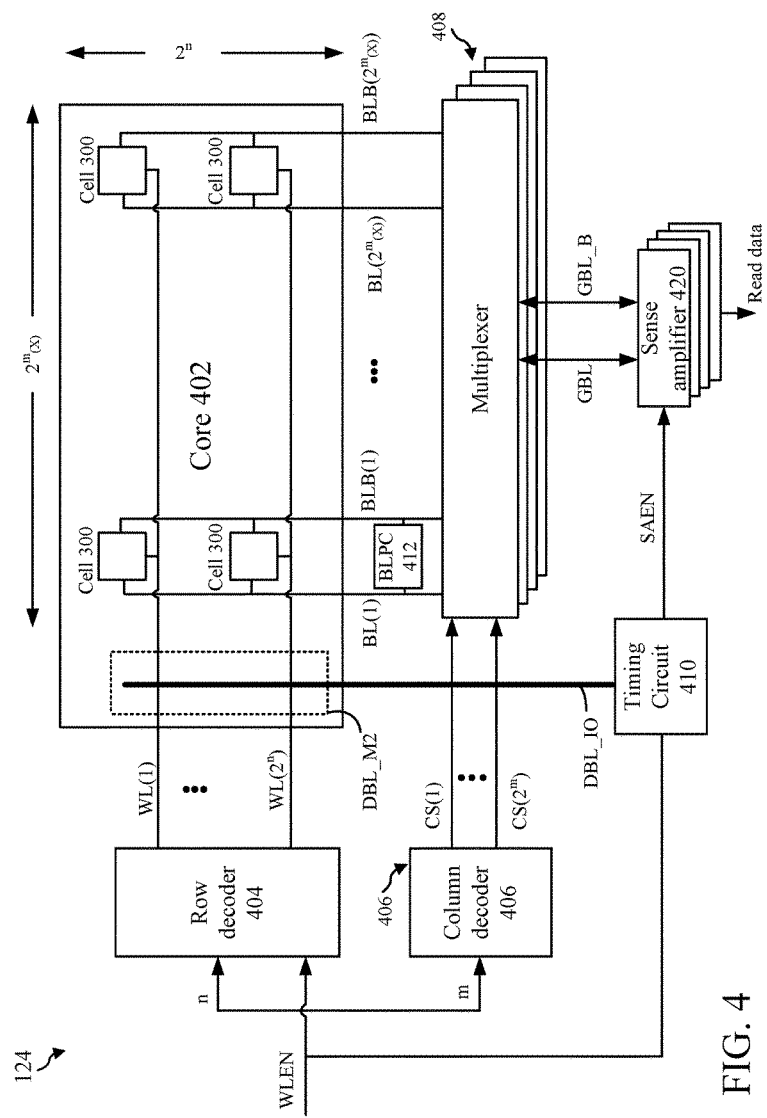
FIG. 4 is a functional block diagram of an exemplary embodiment of a memory of FIG. 3.

FIG. 4 is a functional block diagram of an exemplary embodiment of a memory of FIG. 3. The memory 124 is configured to operate with the sensor 3 for tracking the performance of the memory 124. A read operation is provided as the example, and the write operation and related circuits may be omitted for clarity.

The memory 124 includes a core 402 (e.g., a memory core) with supporting circuitry to decode addresses and perform read and write operations. The core 402 includes memory cells 300 arranged to share connections in horizontal rows and vertical columns. Specifically, each horizontal row of memory cells 300 shares a wordline WL and each vertical column of memory cells 300 shares a pair of bitlines BL and BLB. The size of the core 402 (i.e., the number of cells) may vary depending on a variety of factors, including the specific application, the speed requirements, the layout and testing requirements, and the overall design constraints imposed on the system. The core 402 may contain thousands or millions of memory cells.

In the exemplary embodiment of the memory shown in FIG. 4, the core 402 is made up of $(2^{n} \times 2^{m}(x))$ memory cells 300 arranged in $2^{n}$ horizontal rows and $2^{m}(x)$ vertical columns, where $2^{m}$ is the number of words per row and x is the number of bits outputted for a read access. A peripheral device (not shown) may randomly access any word (i.e., x cells) in the core 402 using an address that is (n+m) bits wide. In other words, the memory 124 outputs x-bits of read data for a read operation, and writes x-bits of write data into the core 402 for a write operation.

In the memory 124, n-bits of the address are provided to the input of a row decoder 404 and m-bits of the address are provided to the input of a column decoder 406. The row decoder 404 converts the n-bit address into $2^{n}$ wordline outputs. A different wordline WL is asserted by the row decoder 404 for each different n-bit row address. As a result, each of the $2^{m}(x)$ memory cells 300 in the horizontal row with the asserted wordline WL is connected to one pair of the $2^{m}(x)$ bitlines BL and BLB through its access transistors as described above in connection with FIG. 3. The data stored in the memory cells are provided to the BL_RD and BLB_RD bitline pairs through the selected pairs of bitlines BL and BLB and the x multiplexers 408 with the asserted wordline WL, as described with FIG. 3. The BL_RD and BLB_RD bitline pairs are provided to the SAs 420 for amplification, and the resulting data of the amplification are outputted as read data.

In some examples, the row decoder 404 may be enabled or disabled (e.g., timed) by the signal WLEN. When the WLEN signal is de-asserted, the row decoder 404 does not assert any wordline. Thus, the WL_ENABLE signal may control a period and timing of asserting a wordline.

For column decoding, the memory 124 provides m bits of address to the column decoder 406. The column decoder 406 provides $2^{m}$ outputs column selects (CS(1)-CS($2^{m}$)) with a different one of the outputs asserted for each different combination of address inputs. The outputs are provided to x multiplexers 408. By way of example, the multiplexers 408 may include passgates. Each multiplexer may be a $2^{m}$:1 multiplexer and selects one of $2^{m}$ bitline pairs read from the core 402 based on the outputs from the column decoder 406. With x multiplexers 408, x bits are selected and outputted for each read access. In some examples, the multiplexers 408 may be viewed as a $2^{m}$:1 selector. The selected x bitline pairs are outputted to SAs 420 as bitline pairs GBL and G_BLB.

A timing circuit 410 is configured to emulate a first operation of the memory 124 to activate a second operation of the memory 124. The term "emulate" is not limited to the emulator being identical to the object emulated. In some examples, the term "emulate" indicates that the emulator models certain aspects, e.g., physical parameters including resistance or capacitance, of the emulating object. In one implementation, the timing circuit 410 may emulate the pull-down of the bitline BL or the bitline BLB by the memory cell 300 for the read operation to activate the SAs 420. In other words, the timing circuit 410 may control the activation of the SAs 420 (e.g., the second operation) based on the emulating of the pull-down of the bitline BL or the bitline BLB by the memory cell 300 (e.g., the first operation). The timing circuit 410 receives the signal WLEN to initiate the emulation of the pull-down of the bitline BL or the bitline BLB.

The timing circuit 410 is coupled to the dummy bitline DBL_M2 to emulate the pull-down of the bitline BL or the bitline BLB by the memory cell 300 in a read operation. The dummy bitline DBL_M2 is routed in the core 402. In some examples, the dummy bitline DBL_M2 may be coupled to dummy memory cells (not shown) to emulate the loading of the bitline BL or BLB. The dummy bitline DBL_M2 is coupled to the rest of the timing circuit 410 via the node DBL_IO. The dummy bitline DBL_M2 may be routed by a metal layer of a same length and the same type and dimensions as the bitline BL or BLB.

In such fashion, the timing circuit 410 tracks the performance of an operation of the memory 124 (e.g., the pull-down of the bitline BL or BLB by the memory cell 300 in a read operation). Thus, the dummy bitline DBL_M2 emulates the loading of the bitline BL or BLB by routing a metal layer of a same length and the same type and dimensions as the bitline BL or BLB and with dummy memory cells coupled thereto to emulate the loading of the memory cells 300 on the bitline BL or BLB. As a result, the timing circuit 410 tracks the operation of the memory 124 over voltage, temperature, and process variations.

Figure 5A:
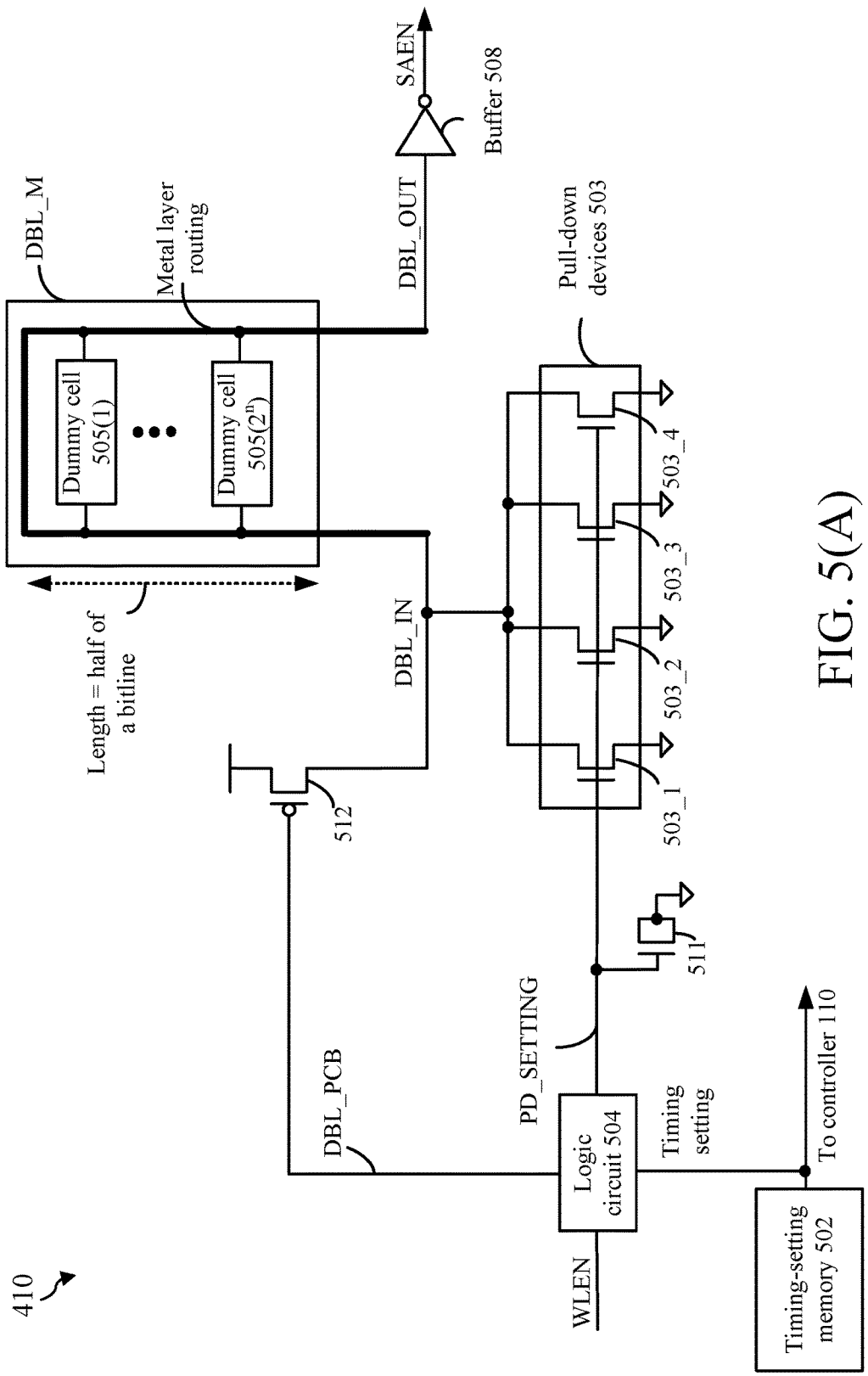
FIG. 5(A) is a circuit diagram of an exemplary embodiment of the timing circuit that tracks the performance of the pull-down of the bitline.

FIG. 5(A) is a circuit diagram of an exemplary embodiment of the timing circuit that tracks the performance of the pull-down of the bitline. The timing circuit 410 is configured to emulate a first operation of the memory 124 (e.g., the pull-down of the bitline BL or BLB by the memory cell 300) to activate a second operation of the memory 124 (e.g., the activation of the SAs 420). In one implementation, the timing circuit 410 includes a dummy bitline DBL_M, and discharges the dummy bitline DBL_M to emulate the pull-down of the bitline BL or BLB.

The timing circuit 410 includes a timing-setting memory 502 to store settings to adjust the pull-down of the bitline BL or BLB. In some examples, the timing-setting memory 502 is a non-volatile memory. In one implementation, the timing-setting memory 502 is implemented with fuses in accordance with schemes known in the art. Performance parameters for an IC, e.g., the IC 102 may be characterized, such as the operating speed of the IC. The timing-setting memory 502 may be set in accordance with the result of the characterization. For example, if the IC 102 is characterized as faster than the normal process, then the timing-setting memory 502 may record such result (e.g., fuses blown to indicate the faster process). The timing-setting memory 502 outputs the timing setting to the logic circuit 504 and to the controller 110.

The logic circuit 504 of timing circuit 410 may be configured to receive the WLEN signal and the timing setting from the timing-setting memory 502. When the WLEN signal is de-asserted (e.g., low level), the timing circuit 410 may in response assert (e.g., output to a low level) the precharge signal DBL_PCB to the p-type transistor 512 to precharge or pull up the dummy bitline DBL_M. As shown, the precharge signal DBL_PCB at the node DBL_IN may be precharged to VDD. In some examples, an assertion of the WLEN signal (e.g., the rising edge) signals the logic circuit 504 to initiate the discharging of the dummy bitline DBL_M. In response to the assertion of the WLEN signal, the logic circuit 504 may output the PD_SETTING signals, based on the timing setting from the timing-setting memory 502.

The wordline loading 511 is coupled to the PD_SETTING signal node. In one implementation, the wordline loading

511 may emulate the loading of the access transistors 314 and 318 of the memory cells 300 coupled to the wordline WL. For example, the wordline loading 511 may correspond to loading of $2^m(x)$ memory cells 300 coupled to the wordline WL. In such fashion, a rise time of the PD_SET-TING signals may emulate the rise time of the wordline WL.

The PD_SETTING signals are provided to the pull-down devices 503 to control the rate of pull-down the dummy bitline DBL at the node DBL_IN. As an example, the pull-down devices 503 are illustrated as including n-type transistors 503_1, 503_2, 503_3, and 503_4. The n-type transistors 503_1, 5032, 503_3, and 503_4 may be of varying sizes, with the number turned on based on the PD_SETTING signals. In such fashion, the strength of the pull-down devices 503 is controlled by the PD_SETTING signals, based on the timing setting of the timing-setting memory 502.

In the fashion presented above, the timing circuit 410 may include multiple settings set forth by the PD_SETTING signals. As an example, the multiple settings of the timing circuit 410 may be referred to as the timing-circuit settings. The multiple settings determine the strengths of the pull-down devices 503 enabled to pull down the dummy bitline DBL_M, and therefore, determine the pull-down time. The pull-down time (of the dummy bitline DBL_M) of the timing circuit 410 is thus based on the multiple timing-circuit settings. The multiple settings may be based on or selected by the timing-setting memory 502.

In one implementation, the dummy bitline DBL_M may emulate the resistance and capacitance of the bitline BL or BLB. The dummy bitline DBL_M includes a metal layer routing to emulate the routing of bitline BL or BLB. For example, the metal layer routing is the same metal layer as the bitline BL or BLB. In one implementation, the metal layer routing of the dummy bitline DBL_M has a length the same or substantially the same as a length of the bitline BL or BLB. In one example, the metal layer routing of the dummy bitline DBL_M is folded with each leg thereof having half of the length of the bitline BL or BLB.

The metal layer routing of the dummy bitline DBL_M is coupled to dummy cells 505 to emulate the loading of the memory cells 300 on the bitline BL or BLB. In one implementation, the dummy cell 505 may include the loading of the access transistors 314 and 318 of the memory cell 300. In some examples, the dummy cell 505 may be identical to the memory cell 300, but with the WL of the dummy cell 505 grounded. In one implementation, a same number of dummy cells 505 is coupled to the metal layer routing of the dummy bitline DBL_M as the number of memory cells 300 coupled to the bitline BL or BLB (e.g., $2^n$). The output DBL_OUT of the dummy bitline DBL_M is provided to the inverting buffer 508, which outputs the SAEN signal to enable the SAs 420.

In such fashion, the dummy bitline DBL_M may emulate and track the resistance and capacitance of the bitline BL or BLB. However, the resistance and capacitance of the dummy bitline DBL_M, although based on the resistance and capacitance of the bitline BL or BLB, may not entirely be the same as the resistance and capacitance of the bitline BL or BLB. For example, the length of the metal layer routing may be greater than the length of the bitline BL or BLB, and/or the loading of the dummy cells 505 may be greater than the loading of the memory cells 300. The greater resistance/capacitance of the dummy bitline DBL_M may allow the timing circuit 410 to emulate the pull-down of the bitline BL or BLB with some margin built-in to tolerate, for example, timing errors caused by process variations. More-over, by using the same type of metal layer and the same type of capacitance for the dummy cell 505, the physical parameters of the dummy bitline DBL_M (e.g., capacitance and/or resistance) may track the physical parameters of the bitline BL or BLB over process, voltage, and/or temperature variations.

Figure 5B:
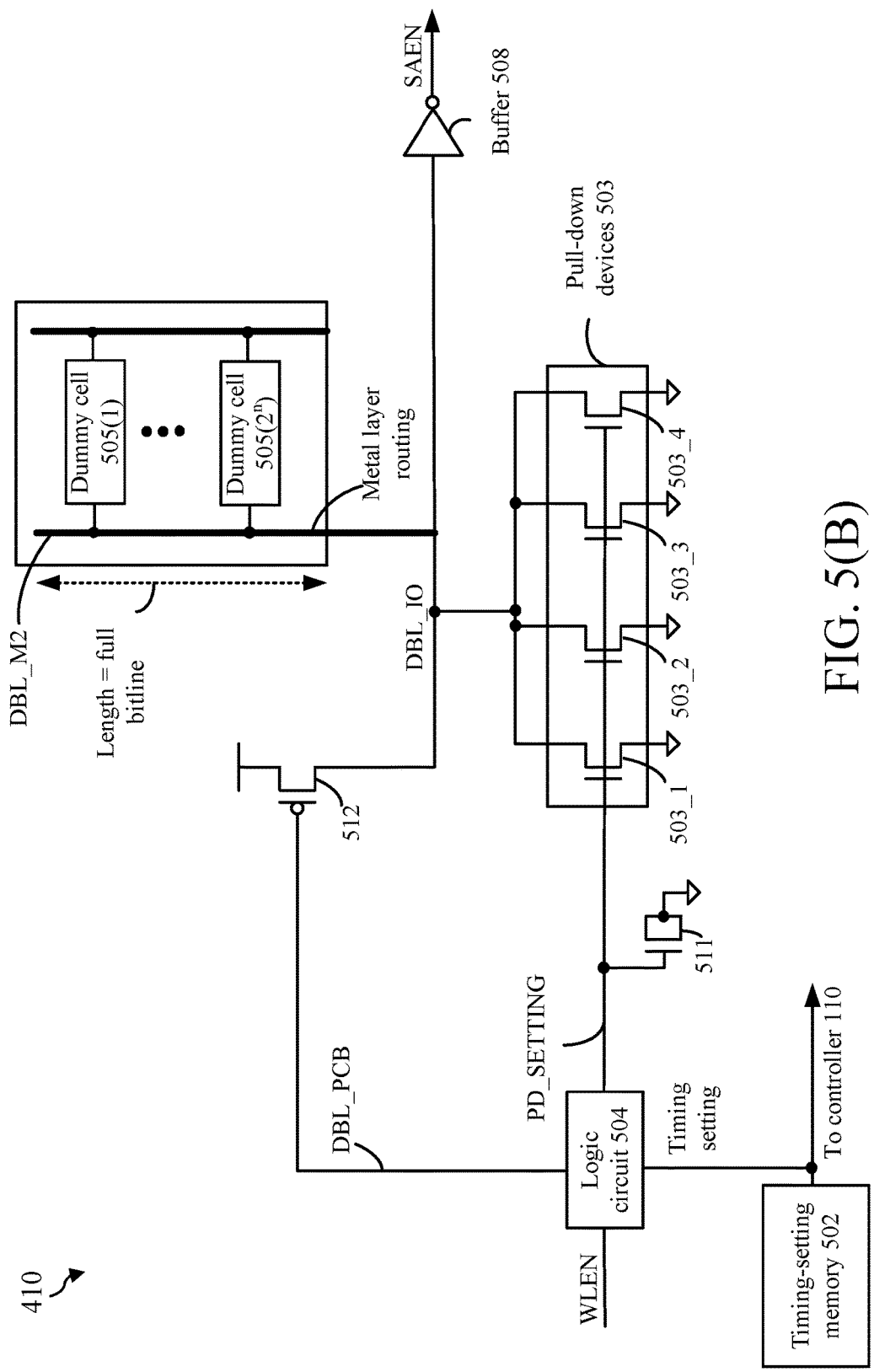
FIG. 5(B) is a circuit diagram of another exemplary embodiment of the timing circuit that tracks the performance of the pull-down of the bitline.

FIG. 5(B) is a circuit diagram of another exemplary embodiment of the timing circuit that tracks the performance of the pull-down of the bitline. The exemplary embodiment of FIG. 5(B) may be incorporated in the memory 124 of FIG. 4. The timing circuit 410 incorporates the dummy bitline DBL_M2, which is coupled to the rest of the timing circuit 410 at the node DBL_IO. The dummy bitline DBL_M2 may be routed for the length of the bitline BL or BLB (e.g., not folded). A number of the dummy cells 505 may be the same or substantially the same as the number of memory cells 300 coupled to the bitline BL or BLB (e.g., $2^n$ cells). As described with FIG. 5(A), the dummy bitline DBL_M2 may emulate and track the resistance and capacitance of the bitline BL or BLB. The resistance and capacitance of the dummy bitline DBL_M2, although based on the resistance and capacitance of the bitline BL or BLB, may not entirely be the same as the resistance and capacitance of the bitline BL or BLB.

Figure 6:
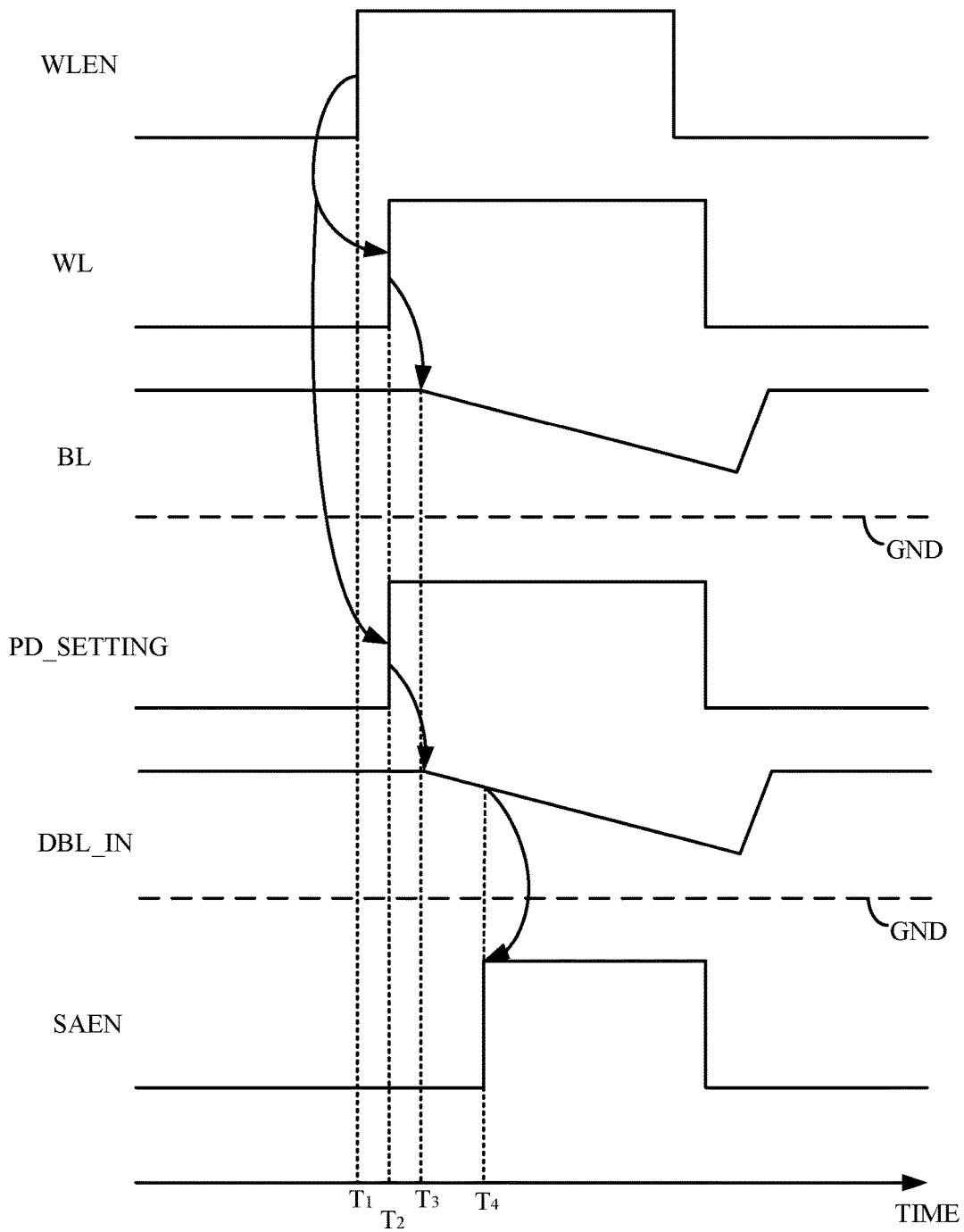
FIG. 6 is a diagram of waveforms of the timing circuit emulating the pull-down of the bitline.

FIG. 6 is a diagram of waveforms of the timing circuit emulating the pull-down of the bitline. The signals are generated by the circuits presented in FIGS. 4 and 5 and are described below. At $T_1$, the WLEN signal is asserted (e.g., rising to a high level). At $T_2$, in response to the assertion of the WLEN signal, wordline WL is asserted (e.g., rising to a high level). As described with FIG. 3, the assertion of the wordline WL couples the memory cell 300 to the bitline pair BL and BLB. By way of example, the memory cell 300 may store the logic 1 by storing a low level (e.g., ground) at the output node 316 and a high level (e.g., VDD) at the output node 320. Thus, at $T_3$, in response to the assertion of the wordline BL, the memory cell 300 starts to pull down the bitline BL.

At $T_2$, in response to the assertion of the WLEN signal, the PD_SETTING signals of the timing circuit 410 are also asserted. Note that the assertion of the PD_SETTING signals needs not be at the same time as the assertion of the wordline WL. That is, in some examples, the timing of the PD_SETTING signals is not closed modeled after the wordline WL. The timing of FIG. 6 is shown as an example. At $T_3$, in response to the assertion of the PD_SETTING signals, the node DBL_IN of the dummy bitline DBL_M discharges. The discharge (e.g., pull-down) of the dummy bitline DBL_M emulates the pull-down of the bitline BL or BLB. For example, the dummy bitline DBL_M is pulled down at a same or substantially the same rate as the pull-down of the bitline BL or BLB by the memory cell 300. At $T_4$, in response to the pull-down of the dummy bitline DBL_M, the signal SAEN is asserted to active the SAs 420.

Figure 7:
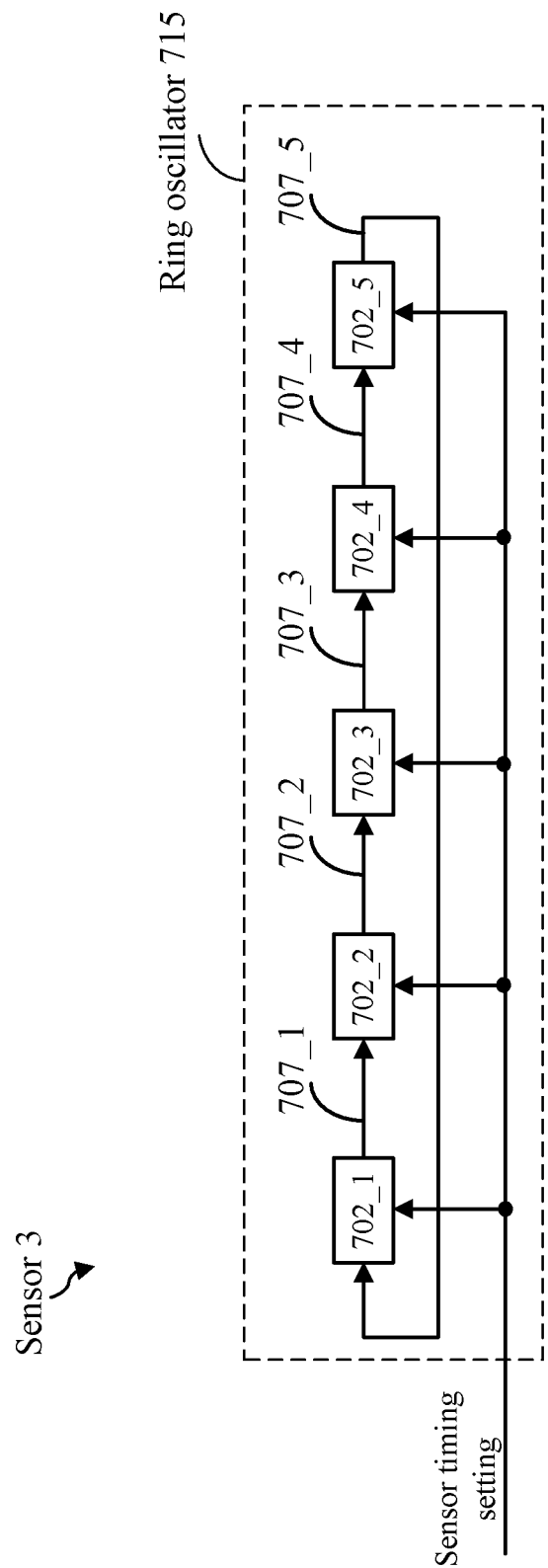
FIG. 7 is a diagram of an exemplary embodiment of a sensor including a ring oscillator.

FIG. 7 is a diagram of an exemplary embodiment of a sensor including a ring oscillator. In one implementation, the sensor 3 includes the ring oscillator 715 configured to emulate a portion of the timing circuit 410. For example, the sensor 3 is configured in part to emulate the dummy bitline DBL_M and/or the pull-down devices 503 of the timing circuit 410. Via the emulation of the timing circuit 410, the sensor 3 (e.g., the ring oscillator 716) provides a means to track a performance characteristic of the memory 124-1 (e.g., the operating speed), based on the timing circuit 410 tracking the memory operation (the bitline pull-down in the memory 124-1). Since the timing circuit 410 tracks the bitline pull-down in the memory 124-1 over process, voltage, and/or temperature variations, the sensor 3 (by emulating the pull-down of the dummy bitline DBL_M in the timing circuit 410) tracks the performance of the memory 124-1 over process, voltage, and/or temperature variations.

The ring oscillator 715 include five inverting stages 702_1 to 702_5 connected as a ring. Each of the inverting stages 702 outputs the signal 707. Each of the inverting stages 702 may be timed or delayed based on the sensor timing setting from, for example, the controller 110. As presented with FIG. 8 below, each of the inverting stages 702 includes a dummy bitline DBL_S to emulate the dummy bitline DBL_M of the timing circuit 410 and a voltage driver to drive the dummy bitline DBL_S. In one implementation, the voltage driver 814 may include a pull-up p-type transistor 812 and pull-down devices 803.

Figure 8:
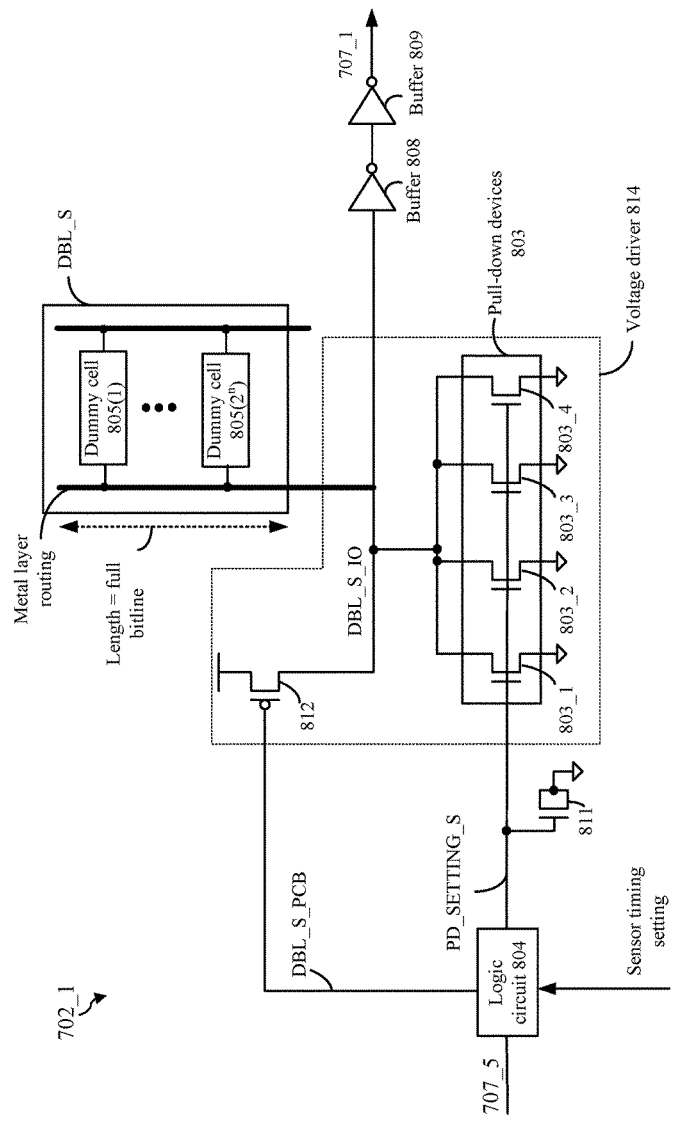
FIG. 8 is a circuit diagram of an exemplary embodiment of the inverting stage of FIG. 7.

FIG. 8 is a circuit diagram of an exemplary embodiment of the inverting stage of FIG. 7. The inverting stage 702_1 is illustrated. The inverting stage 702_1 includes a logic circuit 804 receiving the signal 7075, which is generated by the previous inverting stage 702_5. The logic circuit 804 further receives the sensor timing setting from, for example, the controller 110. In one implementation, the sensor timing setting is the same as the timing setting of the timing circuit 410.

In one implementation, the logic circuit 804 emulates the logic circuit 504 of the timing circuit 410. For example, the logic circuit 804 may output the pull-down control signals PD_SETTING_S in a similar fashion as the logic circuit 504 outputting the pull-down control signals PD_SETTING. For example, in the timing circuit 410, the wordline loading 511 is coupled to the PD_SETTING signal node. In one implementation, the wordline loading 511 may emulate the loading of the access transistors 314 and 318 of the memory cells 300 coupled to the wordline WL (e.g., corresponding to $2^m(x)$ memory cells 300). In the inverting stage 702, the wordline loading 811 may emulate the wordline loading 511 of the timing circuit 410. In such fashion, a rise time of the PD_SETTING_S signals may emulate the rise time of the signals PD_SETTING.

The voltage driver 814 is configured to drive the dummy bitline DBL_S. In one implementation, the voltage driver 814 may include a pull-up p-type transistor 812 and pull-down devices 803. In one implementation, the logic circuit 804 outputs the precharge signal DBL_S_PCB and the pull-down control signals PD_SETTING_S in response to the signal 707_5. When the signal 707_5 is de-asserted (e.g., in a low level), the logic circuit 804 may in response assert the precharge signal DBL_S_PCB (e.g., pull to a low level) to turn on the pull-up p-type transistor 812. Concurrently, the logic circuit 804 may, in response to the de-asserted signal 707_5, de-assert (e.g., pull to a low level) the pull-down control signals PD_SETTING_S to disable the pull-down devices 803. Thus, when the signal 707_5 is de-asserted, the p-type transistor 812 precharges or pulls up the dummy bitline DBL_S at the node DBL_S_IO. In some examples, the pull-up p-type transistor 812 emulates (e.g., having a same or substantially the same size and type) the pull-up p-type transistor 512 of the timing circuit 410.

When the signal 707_5 is asserted (e.g., in a high level), the logic circuit 804 may in response de-assert the precharge signal DBL_S_PCB (e.g., pull to a high level) to turn off the pull-up p-type transistor 812. Concurrently, the logic circuit 804 may, in response to the asserted signal 707_5, assert (e.g., pull to a high level) the pull-down control signals PD_SETTING_S to enable the pull-down devices 803. The logic circuit 804 may generate the pull-down control signals PD_SETTING_S based on the timing setting received from the timing-setting memory 502 (via the sensor timing setting from the controller 110).

The pull-down control signals PD_SETTING_S are provided to the pull-down devices 803 to control the pull-down of the voltage of the dummy bitline DBL_S (e.g., at the node DBL_S_IO). The pull-down devices 803 may include n-type transistors 803_1 to 803_4. In one implementation, the pull-down devices 803 may be configured to emulate the pull-down devices 803 of the timing circuit 410. For example, each of the n-type transistors 803_1 to 803_4 may match the corresponding one of the n-type transistors 503_1 to 503_4 of the timing circuit 410. Thus, the pull-down time of the dummy bitline DBL_S is based on the settings of the pull-down control signals PD_SETTING_S.

In response to the pull-down of the dummy cell DBL_S, the buffers 808 and 809 output the signal 707_1 to the subsequent inverting stage of the ring oscillator 715. For example, the buffer 808 outputs a high level in response to the voltage at the node DBL_S_IO is pulled to a trigger voltage level. In other words, the P-N ratio of the buffer 808 may determine the trigger voltage level of the voltage at the node DBL_S_IO. The ring oscillator 715 is shown to have five inverting stages 702 in a ring configuration. However, as is known in the art, any odd number of inverting stages 702 may be connected in the ring configuration to act as a ring oscillator.

In the fashion presented above, the inverting stage 702 of the sensor 3 may include multiple settings set forth by the PD_SETTING_S signals. As an example, the settings of the inverting stage 702 of the sensor 3 may be referred to as the sensor timing settings. The multiple settings determine the strengths of the pull-down devices 803 enabled to pull down the dummy bitline DBL_S, and therefore, determine the pull-down time. The pull-down time (of the dummy bitline DBL_S) of the inverting stage 702 of the sensor 3 is thus based on the multiple settings. As presented with FIG. 9 below, the ring oscillator 715 may be configured to oscillate at a frequency based on the pull-down time.

Referring again to FIG. 8, in one implementation, the dummy bitline DBL_S may emulate the dummy bitline DBL_M2 of the timing circuit 410 (and not necessarily the bitline BL or BLB). The dummy bitline DBL_S includes a metal layer routing to emulating the metal layer routing of the dummy bitline DBL_M2 of the timing circuit 410. For example, the metal layer routing is the same metal layer as the dummy bitline DBL_M2 of the timing circuit 410. In one implementation, the metal layer routing of the dummy bitline DBL_S has a length the same or substantially the same as a length of the dummy bitline DBL_M2 of the timing circuit 410. In one example, the metal layer routing of the dummy bitline DBL_S is folded with each leg thereof having half of the length of the dummy bitline DBL_M2 of the timing circuit 410.

The metal layer routing of the dummy bitline DBL_S is coupled to dummy cells 805 at the node DBL_S_IO to emulate the loading of the dummy bitline DBL_M2 of the timing circuit 410. In one implementation, the dummy cell 505 may include the loading of the access transistors 314 and 318 of the memory cell 300. In some examples, the dummy cell 805 may be identical to the dummy cell 505 of the DBL_M2 of the timing circuit 410, and a same of number (e.g., $2^n$) of the dummy cells 805 may be coupled to the metal layer routing of the dummy bitline DBL_S as the number of dummy cells 505 of the dummy bitline DBL_M2. The node DBL_S_IO connects the dummy bitline DBL_S and the buffers 808 and 809, which outputs the 707_1 signal to the next inverting stage (e.g., the inverting stage 702_2). As described above, the output 707_1 signal is the inverted and delayed input 707_5 signal. The delay is determined by the pull-down time of the dummy bitline DBL_S.

As presented, the dummy bitline DBL_S emulates the dummy bitline DBL_M2 of the timing circuit. The pull-down devices 803 provide a driving strength to emulate the driving strength of the pull-down devices 503 of the timing circuit 410, as the timing-setting memory 502 controls the settings for both the inverting stage 702 and the timing circuit 410. The pull-down time of the dummy bitline DBL_S of the inverting stage 702_1, based on the sensor timing settings, accordingly emulates the pull-down time of the dummy bitline DBL_M2 of the timing circuit 410, based on the timing-circuit settings. Thus, the pull-down devices 803 pull down the voltage of the dummy bitline DBL_S to emulate the timing circuit 410. Due to the sensor 3 emulating the timing circuit 410, the sensor 3 (e.g., the oscillating frequency of the ring oscillator 715) tracks the timing circuit 410 over process, voltage, and/or temperature variations.

In such fashion, the sensor 3 provides the means to track (e.g., follow) the operating speed (e.g., performance) of the memory 124 over process, voltage, and/or temperature variations. The timing circuit 410 tracks the pull-down speed of the bitline BL or BLB of the memory 124 over process, voltage, and/or temperature variations by incorporating the dummy bitline DBL_M2 and the pull-down devices 503. The sensor 3 includes the ring oscillator 715 which tracks the operating speed of the memory 124 (e.g., oscillating at a frequency that tracks or follows the operating speed of the memory 124) over process, voltage, and/or temperature variations. The ring oscillator 715 includes the inverting stage 702. The inverting stage 702 includes the dummy bitline DBL_S that emulates the dummy bitline DBL_M2 of the timing circuit 410. The inverting stage 702 may further include the pull-down devices 803 that emulate the pull-down devices 503 of the timing circuit 410. Because the operating speed of the memory 124 is based or controlled by the timing circuit 410, the sensor 3 tracking the timing (e.g., the pull-down time) of the timing circuit 410 provides improved tracking of the performance of the memory 124.

Moreover, by utilizing the sensor timing setting from the controller 110, the controller 110 may characterize a performance (e.g., operating speed) of the memory 124 and/or the sensor over the sensor timing settings, before the programming of the timing-setting memory 502, to find the most suitable setting. The controller 110 may further characterize (e.g., monitor) the performance of the memory 124 and/or the sensor over the sensor timing settings, after the programming of the timing-setting memory 502, to analyze the result of the programming. The controller 110 may characterize the performance of the memory 124 and/or the sensor over the sensor timing settings independent of the adjusting the operating parameter (e.g., operating voltage) of the memory 124. For example, the controller 110 may characterize the performance of the memory 124 and/or the at a preset operating voltage or over multiple operating voltages.

In some examples, the dummy bitlines (e.g., DBL_M, DBL_M2, and DBL_S) may emulate loading of multiple bitlines (BL or BLB). For example, the loading of multiple bitlines may be ganged, and the pull-down devices 503 or 803 may be scaled accordingly. In one implementation, multiple dummy bitlines may be routed in the core 402 to connected to operate as a single dummy bitline. In such fashion, effect of local variations (e.g., process or layout variations) may be diminished.

Figure 9:
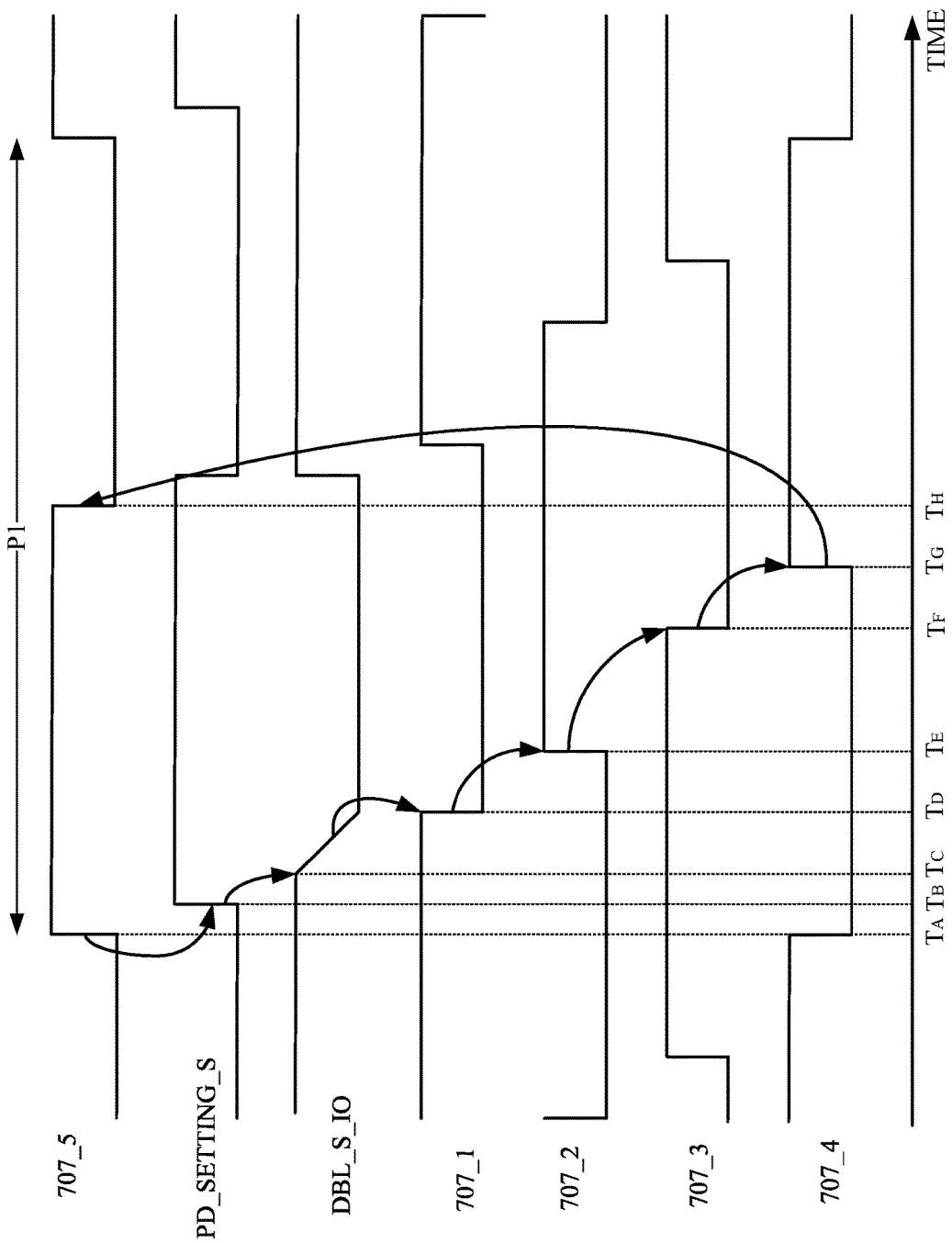
FIG. 9 is a diagram of waveforms of the ring oscillator of the sensor.

FIG. 9 is a diagram of waveforms of the ring oscillator of the sensor. The signals are generated by the circuits presented in FIGS. 7 and 8 and are described below. At $T_A$, the output signal 707_5 of the inverting stage 702_5 goes high. At $T_B$, in response to the signal 707_5 going high, the pull-down signals PD_SETTING_S of the inverting stage 702_1 are set (e.g., to a high level). At $T_C$, in response to the setting of the pull-down signals PD_SETTING_S, the voltage of the dummy bitline DBL_S of the inverting stage 702_1 is pulled down. The voltage level at the node DBL_S_IO is shown. As described with FIG. 8, the voltage of the dummy bitline of the inverting stage 702 may be pulled down at the same rate as that of the timing circuit 410. At $T_D$, in response to the pull-down of the voltage of the dummy bitline DBL_S, the inverting stage 702_1 outputs the signal 707_1 at a low level (e.g., by charging the dummy bitline DBL_S of the inverting stage 702_1) and provides the signal 707_1 to the next inverting stage 702_2.

At $T_E$, in response to the signal 707_1 going low, the inverting stage 702_2 outputs the signal 707_2 at a high level (e.g., by pulling down the dummy bitline DBL_S of the inverting stage 7022) and provides the signal 707_2 to the next inverting stage 702_3. At $T_F$, in response to the signal 7072 going high, the inverting stage 702_3 outputs the signal 707_3 at a low level (e.g., by charging the dummy bitline DBL_S of the inverting stage 702_3) and provides the signal 707_3 to the next inverting stage 7024. At $T_G$, in response to the signal 707_3 going low, the inverting stage 702_4 outputs the signal 707_4 at a high level (e.g., by pulling down the dummy bitline DBL_S of the inverting stage 7024) and provides the signal 707_4 to the next inverting stage 702_5. At $T_H$, in response to the signal 707_4 going high, the inverting stage 702_5 outputs the signal 707_5 at a low level (e.g., by charging the dummy bitline DBL_S of the inverting stage 702_5) and provides the signal 707_5 to the next inverting stage 702_1, and so forth.

As presented above, the ring oscillator 715 oscillates at a frequency of a period P1. The period P1 is based on the pull-down time of the dummy bitline DBL_S in the inverting stages 702. In such fashion, the frequency of the ring oscillator 715 tracks the operating speed of the memory 124 by the inverting stages 702 emulating the timing circuit 410. For example, as described with FIG. 8, the dummy bitline DBL_S of the inverting stage 702 emulates the dummy bitline DBL_M2 of the timing circuit 410, and/or the pull-down devices 803 of the inverting stage 702 emulate the pull-down devices 503 of the timing circuit 410. In some examples, the pull-up time of the dummy bitline DBL_S may be shorter than the pull-down time. and hence the period P1 may be largely determined by the pull-down time of the dummy bitline DBL_S.

Figure 10:
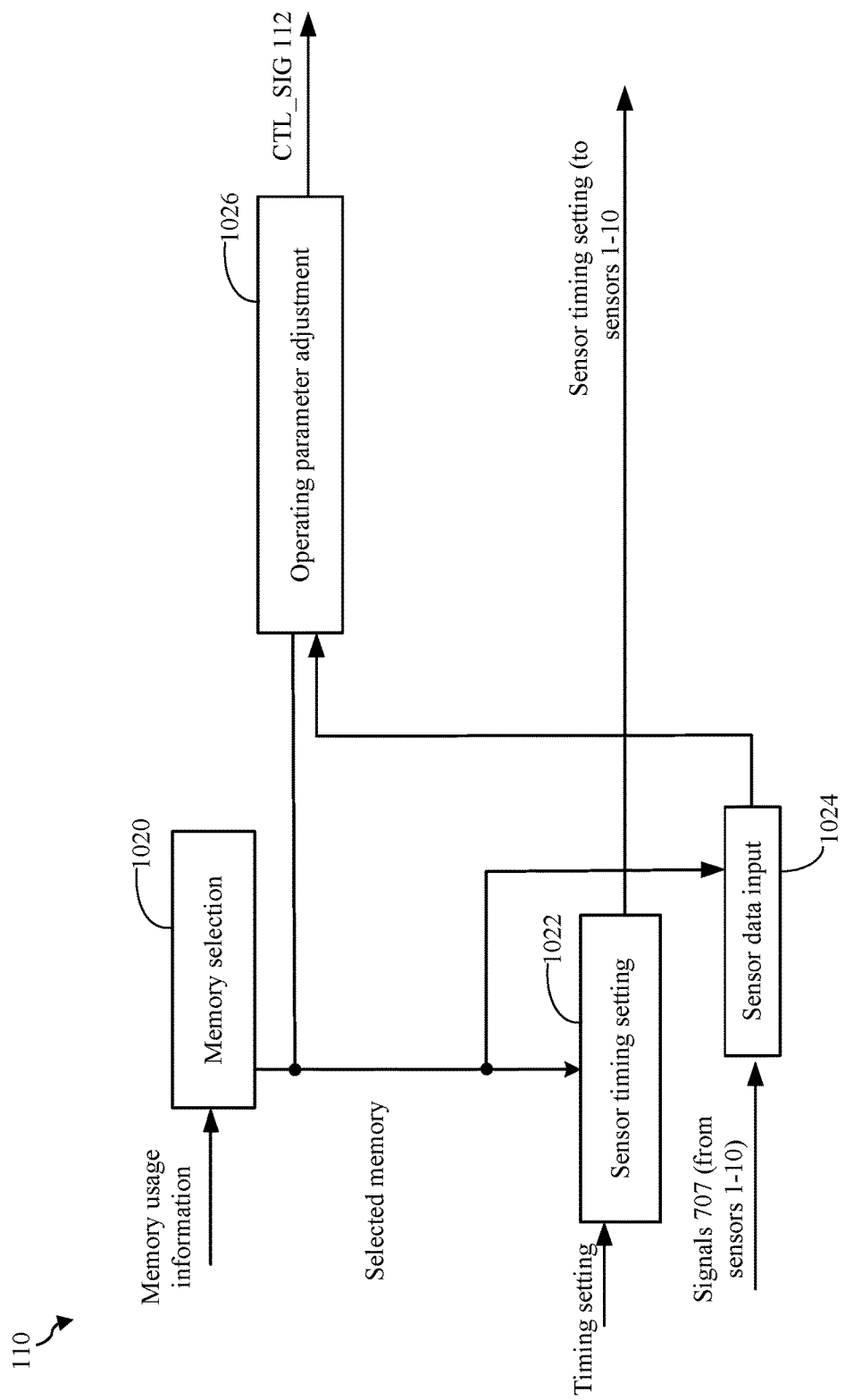
FIG. 10 is a diagram of an exemplary embodiment of a controller.

FIG. 10 is a diagram of an exemplary embodiment of a controller. The controller 110 is illustrated to include various components. In one implementation, the controller 110 provides means for adjusting an operating parameter (e.g., operating voltage) of the memory based on the sensor 3. The controller 110 includes a memory selection component 1020, a sensor timing setting component 1022, a sensor data input component 1024, and an operating parameter adjustment component 1026. These components may be implemented using electronic hardware, computer software, or any combination thereof. Whether such elements are implemented as hardware or software depends upon the particular application and design constraints imposed on the overall system.

By way of example, an element, or any portion of a component, or any combination of components may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

One aspect of the controller 110 allows a sensor to monitor one of multiple memories. As presented above, the sensors 1-10 are not part of the core 402, which allows the sensors 1-10 to be placed among the multiple memories. For example, the sensor 3 may be placed in proximity to both memories 124-1 and 124-2 to able to monitor the performance of both memories. For example, the close proximity of the sensor 3 to both memories 124-1 and 124-2 allow the sensor 3 experience the same or similar process, voltage, and temperature variations as the memories 124-1 and 124-2. The memory 124-2 may be similar to the memory 124-1 and include a timing circuit configured to emulate the bitline pull-down of the memory 124-2 to activate the SAs of the memory 124-2. The sensor 3 may emulate the bitline pull-down of the memory 124-2. The controller 110 may adjust an operating parameter (e.g. the operating voltage) of the memory 124-2 based on the sensor 3 emulating the bitline pull-down of the memory 124-2.

In some examples, the memories 124-1 and 124-2 may have different timing settings. The sensor 3 may set the sensor timing setting to correspond to and to track the slower one of the memories 124-1 and 124-2 (e.g., the memory that is more susceptible to process and/or temperature variations). The controller 110 may adjust the operating voltage for both the memories 124-1 and 124-2 based on the output of the sensor 3, which is set to monitor the slower one of the memories 124-1 and 124-2.

The memory selection component 1020 receives memory usage information and selects a memory among the memories 124-1 and 124-2 for the sensor 3 to monitor. The memory usage information may, for example, indicate one of the memories being in a power-down mode. In some examples, the power-down mode may be any mode that indicate that the memory is not in use. In some examples, the power-down mode may indicate that at least a part of the memory is disconnected from power supplies. For example, the memory usage information may indicate that the memory 124-2 is in a power-down mode, and the memory selection component 1020 may accordingly select the memory 124-1 for the sensor 3 to monitor. Thus, the sensor 3 continues to operate and function while the memory 124-2 is in a power down mode.

The sensor timing setting component 1022 receives the selected memory from the memory selection component 1020 and timing setting information from the memories. For example, the sensor timing setting component 1022 may receive the timing setting from the timing-setting memory 506 from each of the memories 124-1 and 124-2. The sensor timing setting component 1022 may select the timing setting from the selected memory (e.g., the memory 124-1 from the example above) and provide the timing setting as the sensor timing setting. The sensor timing setting component 1022 may alternatively provide various settings to characterize the performance characteristics of the memories before and/or after the programming of the timing-setting memory 502, utilizing the emulating of the timing circuit 410 by the sensor 3. The sensor timing setting is provided to a target sensor (e.g., the sensor 3 for the memory 124-1).

The sensor data input component 1024 receives the output signals (e.g., signal 707_1) from the sensors 1-10. Based on the selected memory, the sensor data input component 1024 may select the output signal of the associated sensor to provide to the operating parameter adjustment component 1026. For example, the memory 124-1 is selected, and the associated output signal 707 of the sensor 3 is provided to the operating parameter adjustment component 1026.

The operating parameter adjustment component 1026 is configured to adjust an operating parameter (e.g., operating voltage) of the selected memory based on the sensor emulating the portion of the timing circuit 410 of the selected memory. As described with FIGS. 5-9, the sensor 10 includes inverting stages 702 which emulate at least the dummy bitline and the pull-down devices of the timing circuit 410. The operating parameter adjustment component 1026 outputs the CTL_SIG 112 signal to adjust the operating voltage of the selected memory. For example, in a case that the sensor output signal 707 indicates that the selected memory 124-1 operates faster than the workload required (e.g., the output signal 707 oscillates at a faster frequency than a threshold frequency based on the workload), the CTL_SIG 112 signal may adjust the operating voltage of the memory 124-1. See the descriptions of FIGS. 1 and 2. Accordingly, the power consumption and thermal stress may both be reduced.

Figure 11:
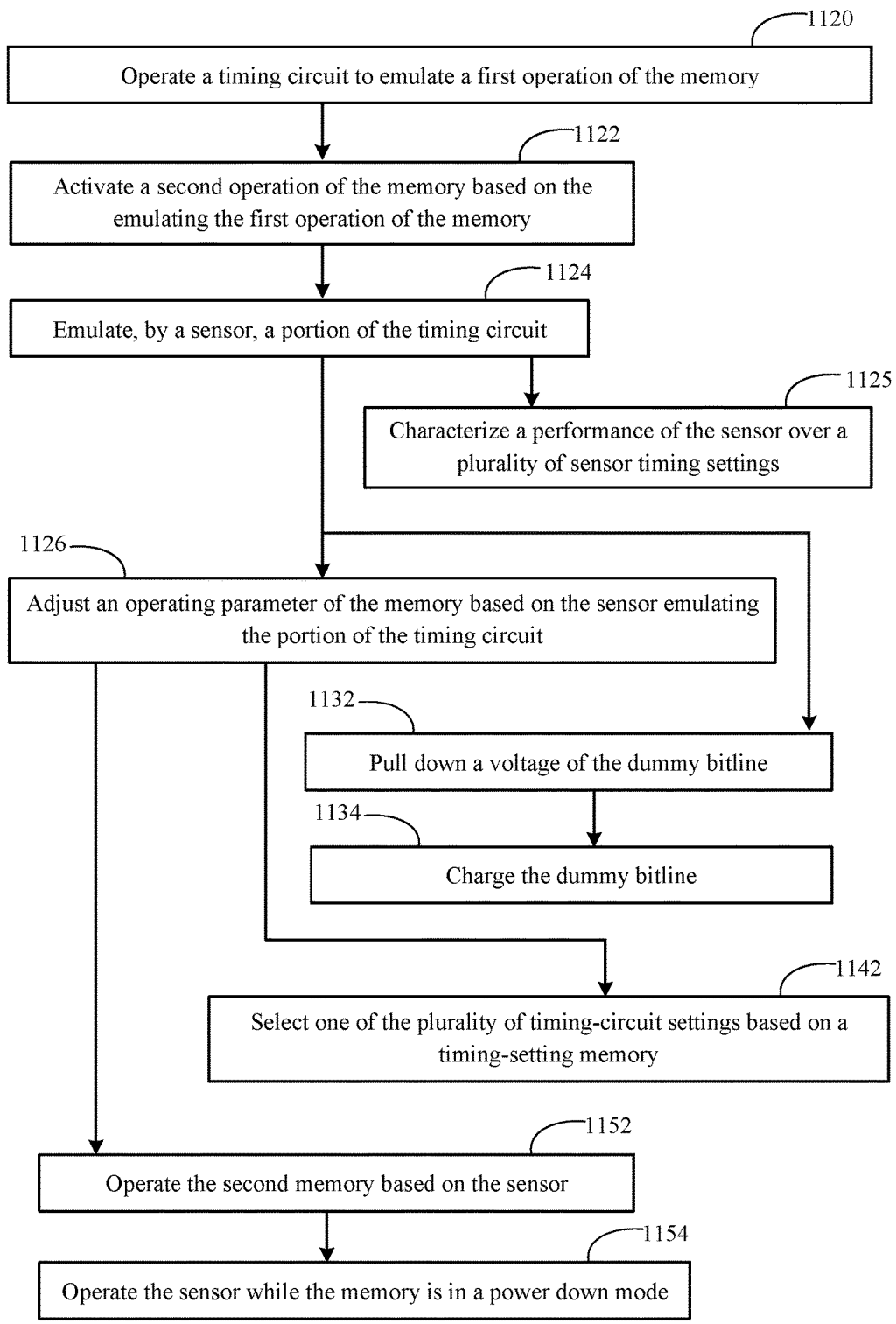
FIG. 11 is a flowchart of a method to operate the memory by the controller of FIG. 10.

FIG. 11 is a flowchart of a method to operate the memory by the controller of FIG. 10. The method may be performed by the controller 110, the sensor 3, and the timing circuit 410 of the memory presented above. At 1120, a timing circuit emulates a first operation of the memory. Referring to FIG. 5, for example, the timing circuit 410 emulates the pull-down of the bitline BL or BLB. At 1122, a second operation of the memory is activated based on the emulating the first operation of the memory. Referring to FIGS. 4 and 5, for example, the SAs 420 are activated by the SAEN signal to amplified the data on the bitline pair BL and BLB, based on the timing circuit 410 emulating the pull-down of the bitline BL or BLB.

At 1124, a portion of the timing circuit is emulated by a sensor. Referring to FIGS. 7 and 8, for example, the sensor includes inverting stages 702. The inverting stage 702 emulates the pull-down of the dummy bitline DBL_M of the timing circuit 410. At 1126, an operating parameter of the memory is adjusted based on the sensor emulating the portion of the timing circuit. Referring to FIGS. 1 and 10, for example, the controller 110 adjust the operating voltage of the memory 124 based on the sensor 3 (e.g., the inverting stage 702 thereof) emulating the pull-down of the dummy bitline DBL_M of the timing circuit 410.

At 1125, a performance of the sensor is characterized over a plurality of sensor timing settings. For example, by utilizing the sensor timing setting from the controller 110, the controller 110 may characterize a performance (e.g., operating speed) of the memory 124 and/or the sensor over the sensor timing settings, before the programming of the timing-setting memory 502, to find the most suitable setting. The controller 110 may further characterize (e.g., monitor) the performance of the memory 124 and/or the sensor over the sensor timing settings, after the programming of the timing-setting memory 502, to analyze the result of the programming. The controller 110 may characterize the performance of the memory 124 and/or the sensor over the sensor timing settings independent of the adjusting the operating parameter (e.g., operating voltage) of the memory 124. For example, the controller 110 may characterize the performance of the memory 124 and/or the at a preset operating voltage or over multiple operating voltages.

At 1132, a voltage of the dummy bitline is pulled down (to emulate the portion of the timing circuit). Referring to FIGS. 8 and 9, for example, the sensor 3 (e.g., the inverting stage 702 thereof) pulls down the dummy bitline DBL_S to emulate the pull-down of the dummy bitline DBL_M by the timing circuit 410. At 1134, the dummy bitline is charged (to emulate the portion of the timing circuit). Referring to FIGS. 8 and 9, for example, the sensor 3 (e.g., the inverting stage 702 thereof) charges the dummy bitline DBL_S to emulate the charging of the dummy bitline DBL_M by the timing circuit 410. At 1142, one of the plurality of timing-circuit settings is selected based on a timing-setting memory. For example, referring to FIG. 5, the timing-circuit settings are based from the timing-setting memory 502.

At 1152, the second memory is operated based on the sensor. Referring to FIGS. 2 and 10, for example, the sensor 3 may be configured to monitor the second memory 124-2. A timing circuit (of the memory 124-2; e.g., the second timing circuit) may operate to emulate the bitline pull-down of a memory 124-2. The second timing circuit may enable or activate the SAs 420 (of the memory 124-2) based on the emulating the bitline pull-down of the memory 124-2. The sensor 3 may emulate the pull-down of the dummy bitline of the second timing circuit. The controller 110 may adjust the operating voltage of the memory 124-2 based on the sensor 3 emulating the pull-down of the dummy bitline of the second timing circuit. At 1154, the sensor is operated while the memory is in a power down mode. Referring to FIG. 10, for example, the controller may select the sensor 3 to monitor the performance of the memory 124-1, while the memory 124-2 is in a power-down mode.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f), unless the element is expressly recited using the phrase "means for" or, in the case of a method claim, the element is recited using the phrase "step for."

What is claimed is:

1. An apparatus, comprising:
   a memory;
   a timing circuit configured to emulate a first operation of the memory to activate a second operation of the memory;
   a sensor configured to emulate a portion of the timing circuit; and
   a controller configured to adjust an operating parameter of the memory based on the sensor emulating the portion of the timing circuit.

2. The apparatus of claim 1, wherein the sensor comprises a ring oscillator, and the ring oscillator comprises at least one stage having a dummy bitline.

3. The apparatus of claim 2, wherein the at least one stage further comprises a voltage driver coupled to the dummy bitline.

4. The apparatus of claim 3, wherein the voltage driver comprises a pull-down device to pull down a voltage of the dummy bitline to emulate the timing circuit.

5. The apparatus of claim 4, wherein the voltage driver further comprises a pull-up device to charge the dummy bitline to emulate the timing circuit.

6. The apparatus of claim 1, wherein the sensor comprises a plurality of sensor timing settings, and a timing of the sensor is based on the plurality of sensor timing settings.

7. The apparatus of claim 6, wherein the timing circuit comprises a plurality of timing-circuit settings, and a timing of the timing circuit is based on the plurality of timing-circuit settings.

8. The apparatus of claim 7, further comprising a timing-setting memory to select one of the plurality of timing-circuit settings.

9. The apparatus of claim 7, wherein the timing of the sensor based on each of the plurality of sensor timing settings corresponds to the timing of the timing circuit based on each of the plurality of timing-circuit settings.

10. The apparatus of claim 9, wherein the controller is further configured to characterize a performance of the sensor over each of the plurality of sensor timing settings.

11. The apparatus of claim 1, further comprising:
a second memory;
a second timing circuit configured to emulate a first operation of the second memory to activate a second operation of the second memory,
wherein the sensor is further configured to emulate a portion of the second timing circuit, and
the controller is further configured to adjust an operating parameter of the second memory based on the sensor emulating the portion of the second timing circuit.

12. The apparatus of claim 11, wherein the controller is configured to operate the sensor while the second memory is in a power down mode.

* * * * *